US012757326B2

(12) United States Patent
Lee

(10) Patent No.: US 12,757,326 B2
(45) Date of Patent: Oct. 6, 2026

(54) PRINTED CIRCUIT BOARD

(71) Applicant: SAMSUNG ELECTRO-MECHANICS CO., LTD., Suwon-si (KR)

(72) Inventor: Seung Min Lee, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 190 days.

(21) Appl. No.: 18/673,504

(22) Filed: May 24, 2024

(65) Prior Publication Data

US 2025/0089163 A1 Mar. 13, 2025

(30) Foreign Application Priority Data

Sep. 7, 2023 (KR) ........................ 10-2023-0119267

(51) Int. Cl.
*H05K 1/11* (2006.01)

(52) U.S. Cl.
CPC ..... *H05K 1/11* (2013.01); *H05K 2201/10242* (2013.01)

(58) Field of Classification Search
CPC . H05K 1/111; H05K 1/11; H05K 1/02; H05K 3/4007; H05K 1/113; H05K 1/115; H05K 1/0256; H05K 2201/10242
USPC ......................... 174/261, 250, 255, 260, 262
See application file for complete search history.

(56) References Cited

U.S. PATENT DOCUMENTS

| | | | | |
|---|---|---|---|---|
| 8,153,901 B2 * | 4/2012 | Kondo | H05K 3/4617 174/250 |
| 8,664,534 B2 * | 3/2014 | Takeuchi | H05K 1/0281 174/254 |
| 8,889,994 B2 * | 11/2014 | Kim | H05K 3/4007 174/262 |
| 12,010,795 B2 * | 6/2024 | Nam | H05K 1/0256 |
| 12,213,251 B2 * | 1/2025 | Kim | H05K 1/113 |
| 2013/0153266 A1 * | 6/2013 | Hyun | H05K 1/0216 174/250 |

FOREIGN PATENT DOCUMENTS

| | | |
|---|---|---|
| JP | H07-245452 A | 9/1995 |
| JP | 2021-022586 A | 2/2021 |

* cited by examiner

*Primary Examiner* — Angel R Estrada
(74) *Attorney, Agent, or Firm* — Morgan, Lewis & Bockius LLP

(57) ABSTRACT

A printed circuit board including: an insulating layer; a wiring layer disposed on an outermost side of the insulating layer and including a first pad and a first pattern; a first post disposed on the first pattern; and a resist layer disposed on the insulating layer and covering the wiring layer and the first post, wherein the resist layer may have a first protrusion in a region covering the first post and may have a first opening exposing the first pad from the resist layer.

20 Claims, 15 Drawing Sheets

PRINTED CIRCUIT BOARD

CROSS-REFERENCE TO RELATED APPLICATION(S)

This application claims benefit of priority to Korean Patent Application No. 10-2023-0119267 filed on Sep. 7, 2023, in the Korean Intellectual Property Office, the disclosure of which is incorporated herein by reference in its entirety.

TECHNICAL FIELD

The present disclosure relates to a printed circuit board.

Typically, a bump bonding structure is applied to the bonding of a die and a substrate. For example, a pad formed on the die may be in contact with a microball attached to an upper portion of the substrate to connect the die and the substrate. On the other hand, in such a bump bonding structure, when volume control of the solder ball fails, when a shape of the solder ball is abnormal, or when an abnormality occurs in the alignment of the die and the substrate, a defect in die assembly may occur. For example, adjacent solder balls may come into contact with each other, causing short-circuit defects.

SUMMARY

An aspect of the present disclosure is to provide a printed circuit board that may improve short-circuit defects in a bump bonding structure.

One of several solutions proposed through the present disclosure is to form a protrusion that may serve as a dam around an opening exposing a pad, by forming a post around an outermost pad of a substrate for bump bonding and cover the post with a resist layer.

For example, a printed circuit board according to an example embodiment may include: an insulating layer; a wiring layer disposed on an outermost side of the insulating layer and including a first pad and a first pattern; a first post disposed on the first pattern; and a resist layer disposed on the insulating layer and covering the wiring layer and the first post, wherein the resist layer may include (i) a first protrusion in a region covering the first post and (ii) a first opening over the first pad.

For example, a printed circuit board according to an example embodiment may include: an insulating layer; a metal pad disposed at an outermost side of the insulating layer; a metal post disposed on the outermost side of the insulating layer and disposed around the metal pad, wherein an outermost surface of the metal post is disposed above an outermost surface of the metal pad; and a resist layer disposed on the outermost surface of the insulating layer, and covering the metal pad and the metal post, wherein an outermost surface of the resist layer may protrude from a region covering the metal post and may include an opening over the metal pad.

An effect of the present disclosure is to provide a printed circuit board that may improve short-circuit defects in a bump bonding structure.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
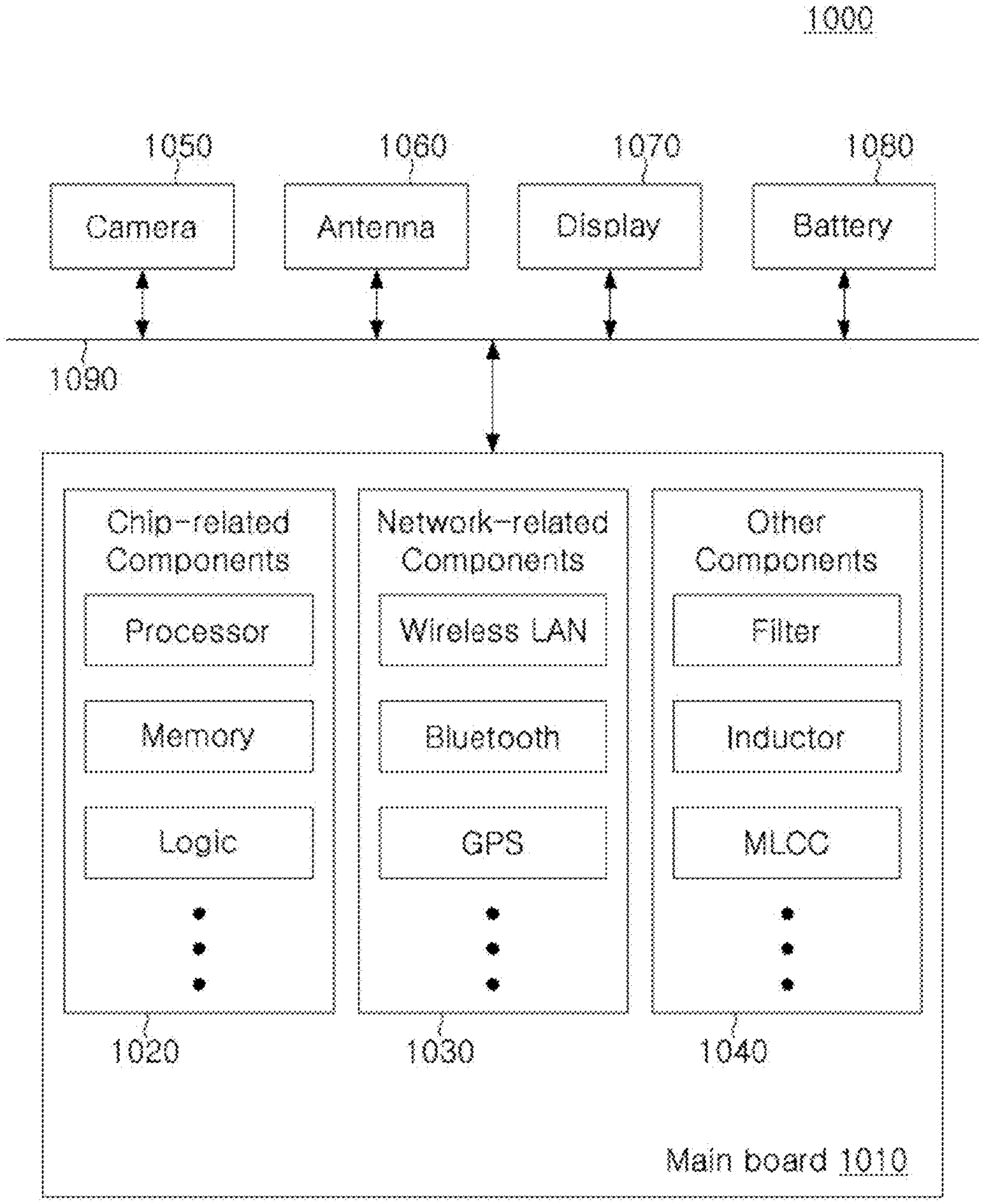
FIG. 1 is a block diagram schematically illustrating an example of an electronic device system.

Hereinafter, the present disclosure will be described with reference to the accompanying drawings. In the drawings, the shape and size of the elements may be exaggerated or reduced for clarity of description.

Electronic Device

FIG. 1 is a block diagram schematically illustrating an example of an electronic device system.

Referring to FIG. 1, an electronic device 1000 accommodates a main board 1010 therein. Chip-related components 1020, network-related components 1030, and other components 1040, and the like, are physically and/or electrically connected to the main board 1010. These components are also coupled to other electronic components to be described below to form various signal lines 1090.

The chip-related components 1020 may include a memory chip such as a volatile memory (e.g., a DRAM), a non-volatile memory (e.g., a ROM), a flash memory, or the like; an application processor chip such as a central processor (e.g., a CPU), a graphics processor (e.g., a GPU), a digital signal processor, a cryptographic processor, a microprocessor, a microcontroller, or the like; and a logic chip such as an analog-to-digital (ADC) converter, an application-specific IC (ASIC), or the like. However, the chip-related components 1020 are not limited thereto, and may also include other types of chip-related electronic components. Furthermore, the chip-related components 1020 may be coupled to each other. The chip-related component 1020 may be in the form of a package including the above-described chip or electronic component.

The network-related components 1030 may include wireless fidelity (Wi-Fi) (such as IEEE 802.11 family), worldwide interoperability for microwave access (WiMAX) (such as IEEE 802.16 family), IEEE 802.20, long term evolution (LTE), evolution data only (Ev-DO), HSPA+, HSDPA+, HSUPA+, EDGE, GSM, GPS, GPRS, CDMA, TDMA, DECT, Bluetooth, 3G, 4G, and 5G protocols, and any other wireless and wired standards or protocols specified thereafter. However, the network-related components 1030 are not limited thereto, and may also include any of a number of other wireless or wired standards or protocols. Furthermore, the network-related components 1030 may be coupled to the chip-related components 1020.

Other components 1040 may include a high frequency inductor, a ferrite inductor, a power inductor, ferrite beads, a low temperature co-firing ceramic (LTCC), an electromagnetic interference (EMI) filter, a multilayer ceramic capacitor (MLCC), or the like. However, other components are not limited thereto, and may also include passive components in the form of chip components used for various other purposes. In addition, other components 1040 may be coupled to each other, together with the chip-related components 1020 and/or the network-related components 1030.

Depending on a type of electronic device 1000, the electronic device 1000 may include other electronic components that may or may not be physically and/or electrically connected to main board 1010. These other electronic components may include, for example, a camera module 1050, an antenna module 1060, a display 1070, and a battery 1080. However, these other electronic components are not limited thereto, but may also include an audio codec, a video codec, a power amplifier, a compass, an accelerometer, a gyroscope, a speaker, a mass storage device (e.g., a hard disk drive), a compact disk (CD), a digital versatile disk (DVD), or the like. Furthermore, these other electronic components may also other electronic components used for various purposes depending on a type of electronic device 1000.

The electronic device 1000 may be a smartphone, a personal digital assistant, a digital video camera, a digital still camera, a network system, a computer, a monitor, a tablet PC, a laptop PC, a netbook PC, a television, a video game machine, a smartwatch, an automotive component. However, the electronic device 1000 is not limited thereto, and may be any other electronic device that processes data in addition thereto.

Figure 2:
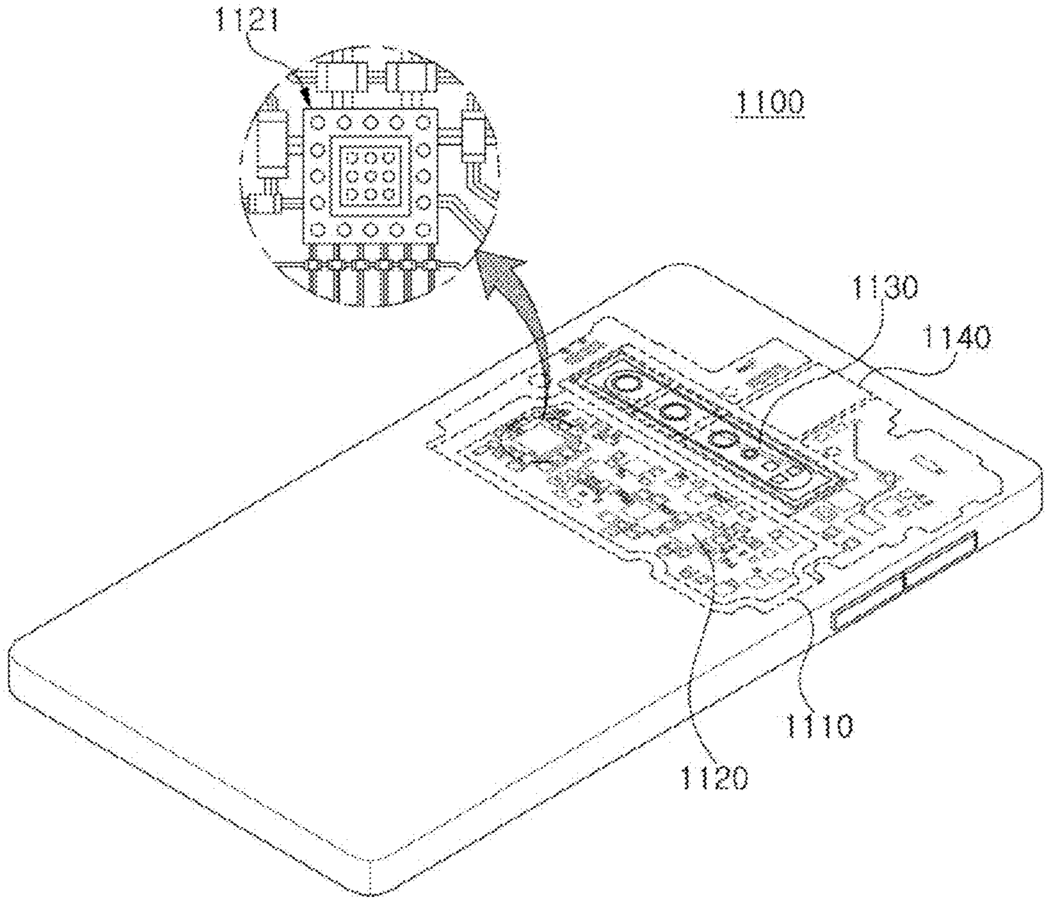
FIG. 2 is a perspective view schematically illustrating an example of an electronic device.

FIG. 2 is a perspective view schematically illustrating an example of an electronic device.

Referring to FIG. 2, an electronic device may be, for example, a smartphone 1100. A motherboard 1110 may be accommodated in the smartphone 1100, and various components 1120 may be physically and/or electrically connected to the motherboard 1110. Furthermore, other components that may or may not be physically and/or electrically connected to the motherboard 1110, such as a camera module 1130 and/or a speaker 1140, may be accommodated in the smartphone 1100. Some of the components 1120 may be the chip-related components described above, for example, the component package 1121, but the present disclosure is not limited thereto. The component package 1121 may be in the form of a printed circuit board in which an electronic component including an active component and/or a passive component is mounted on a surface. Alternatively, the component package 1121 may be in the form of a printed circuit board in which an active component and/or a passive component are embedded. On the other hand, the electronic device is not necessarily limited to the smartphone 1100, and may be other electronic devices as described above.

Printed Circuit Board

Figure 3:
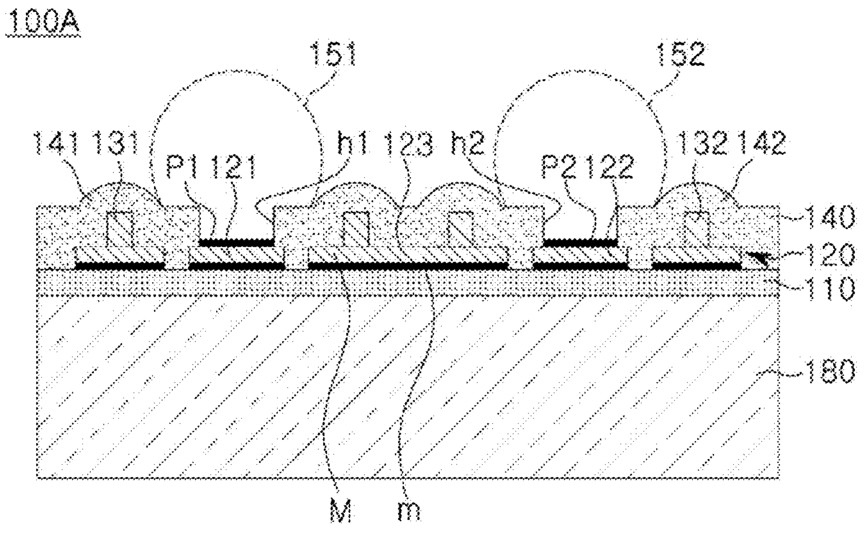
FIG. 3 is a cross-sectional view schematically illustrating an example of a printed circuit board.
Figure 4:
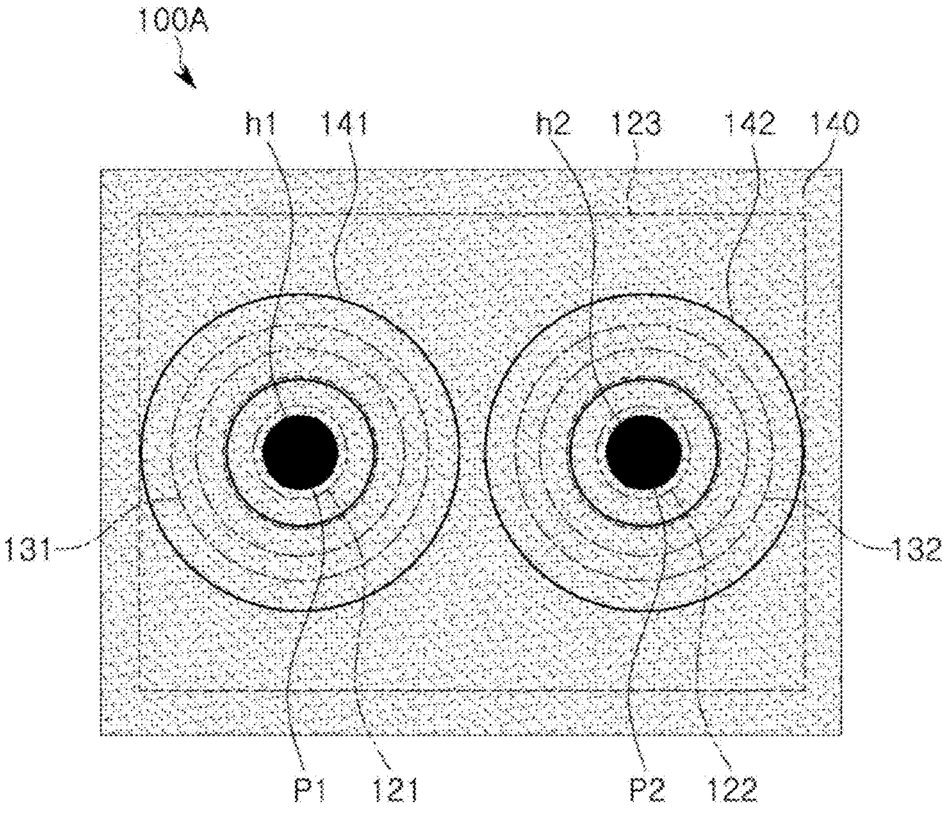
FIG. 4 is a schematic plan view illustrating a top-view of the printed circuit board illustrated in FIG. 3.

FIG. 3 is a cross-sectional view schematically illustrating an example of a printed circuit board, and FIG. 4 is a schematic plan view illustrating a top-view of the printed circuit board illustrated in FIG. 3.

Referring to the drawings, a printed circuit board 100A according to an example embodiment may include an insulating layer 110, a wiring layer 120 disposed on an outermost side of the insulating layer 110 and including first and second pads 121 and 122 spaced apart from each other and a first pattern 123, first and second posts 131 and 132 spaced apart from each other on the first pattern 123, and a resist layer 140 disposed on the insulating layer 110 and having first and second openings h1 and h2 respectively exposing the first and second pads 121 and 122 and having first and second protrusions 141 and 142 in regions respectively covering the first and second posts 131 and 132. The first and second posts 131 and 132 may be disposed to surround the first and second pads 121 and 122, respectively, and the first and second protrusions 141 and 142 may be disposed to surround the first and second openings h1 and h2, respectively. First and second surface treatment layers P1 and P2 may be disposed on an exposed surfaces of each of the first and second pads 121 and 122, respectively, and first and second solder bumps 151 and 152 filling the first and second openings h1 and h2, respectively, and connected to the first and second surface treatment layers P1 and P2 may be disposed on the resist layer 140.

As described above, the printed circuit board 100A according to an example embodiment may have a bump bonding structure on which electronic components such as dies may be mounted. In this case, the first and second posts 131 and 132 disposed on a higher level may be disposed around the first and second pads 121 and 122, respectively. For example, an upper surface of each of the first and second posts 131 and 132 may be disposed higher than an upper surface of each of the first and second pads 121 and 122. Accordingly, the first and second protrusions 141 and 142 may be disposed around the first and second openings h1 and h2 in the form of a dam. For example, each of the first and second posts 131 and 132 may surround the first and second pads 121 and 122 in a ring shape, so that the first and second protrusions 141 and 142 may also surround the first and second openings h1 and h2, respectively, in a ring shape. Accordingly, in a bump bonding process in which electronic components such as dies are attached to the first and second solder bumps 151 and 152, the first and second solder bumps 151 and 152 are connected to each other to effectively prevent short circuits from occurring.

Meanwhile, the printed circuit board 100A according to an example embodiment may further include a wiring structure 180, if necessary, and the insulating layer 110 may be an uppermost insulating layer of the wiring structure 180. For example, the wiring structure 180 may be a multilayer substrate including a plurality of insulating layers, a plurality of wiring layers, and a plurality of via layers. Accordingly, the printed circuit board 100A according to an example embodiment may also be a multilayer package board. The wiring structure 180 may be a core-type substrate or a coreless-type substrate. The wiring structure 180 may be an organic substrate, but may also be a silicon or ceramic substrate, if necessary.

Hereinafter, components of the printed circuit board 100A according to an example embodiment will be described in more detail with reference to the drawings.

The insulating layer 110 may include an insulating material. The insulating material may include a thermosetting resin such as an epoxy resin, a thermoplastic resin such as polyimide, or a material including an inorganic filler, an organic filler, and/or a glass fiber (Glass Fiber, Glass Cloth or Glass Fabric) along with resins. For example, the insulating material may be a non-photosensitive insulating material such as an Ajinomoto Build-up Film (ABF) or Prepreg (PPG), but the present disclosure is not limited thereto, and other polymer materials may be used as the insulating material.

The wiring layer 120 may include a metallic material. The metallic material may include copper (Cu), aluminum (Al), silver (Ag), tin (Sn), gold (Au), nickel (Ni), lead (Pb), titanium (Ti), and/or alloys thereof. The metallic material may include, preferably, copper (Cu), but the present disclosure is not limited thereto. The wiring layer 120 may perform various functions depending on the design. For example, the wiring layer 120 may include a signal pattern, a power pattern, and a ground pattern. Each of these patterns may have various forms such as lines, planes, and pads. For example, each of the first and second pads 121 and 122 may be a pad-shaped signal pattern, and the first pattern 123 may be a plane-shaped ground pattern, but the present disclosure is not limited thereto. The wiring layer 120 may include a seed layer (m) and a plating layer (M) formed on the seed layer. The seed layer (m) may be an electroless plating layer (or chemical copper) and/or a sputtering layer, and the plating layer (M) may be an electrolytic plating layer (or electrolytic copper), but the present disclosure is not limited thereto. The wiring layer 120 may protrude upwardly based on an upper surface of the insulating layer 110. For example, the wiring layer 120 may have a protruding pattern.

The first and second posts 131 and 132 may include a metallic material. The metallic material may include copper (Cu), aluminum (Al), silver (Ag), tin (Sn), gold (Au), nickel (Ni), lead (Pb), titanium (Ti), and/or alloys thereof. The metallic material may include, preferably, copper (Cu), but the present disclosure is not limited thereto. The first and second posts 131 and 132 may include an electrolytic plating layer (or electrolytic copper), but the present disclosure is not limited thereto.

The resist layer 140 may include a liquid type solder resist, but the present disclosure is not limited thereto. The resist layer 140 may have first and second openings h1 and h2, and the first and second openings h1 and h2 may be formed with Solder Mask Defined (SMD) and/or Non Solder Mask Defined (NSMD). The upper surface of the resist layer 140 may protrude from the first and second protrusions 141 and 142.

The first and second surface treatment layers P1 and P2 are not particularly limited as long as they are known in the art, and the first and second surface treatment layers P1 and P2 may be formed of, for example, electrolytic gold plating, electroless gold plating, Organic Solderability Preservative (OSP) or electroless tin plating, electroless silver plating, electroless nickel plating/substituted gold plating, Direct Immersion Gold (DIG) plating, and Hot Air Solder Leveling (HASL), but the present disclosure is not limited thereto.

The first and second solder bumps 151 and 152 may be formed of a low melting point metal, for example, solder such as tin (Sn)-aluminum (Al)-copper (Cu), but this is only an example, and a material thereof is not limited thereto.

Figure 5:
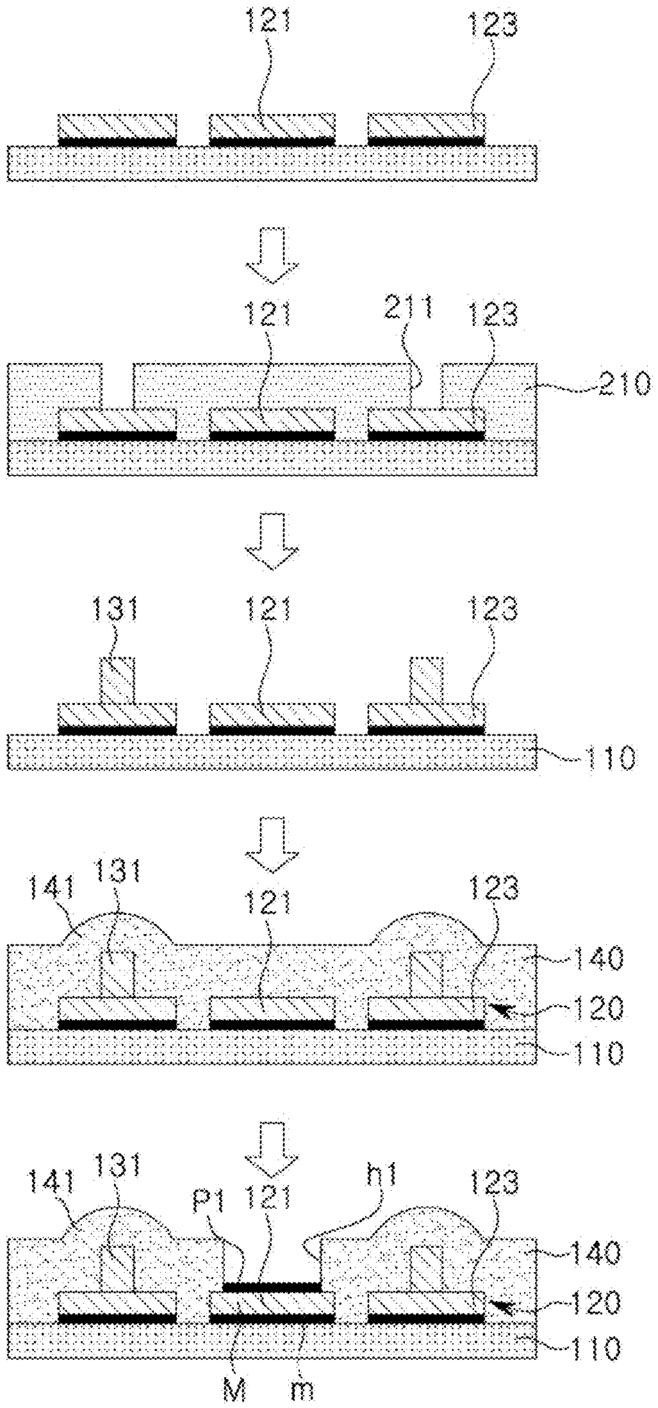
FIG. 5 is a process diagram schematically illustrating a manufacturing example of the printed circuit board illustrated in FIG. 3.

FIG. 5 is a process diagram schematically illustrating a manufacturing example of the printed circuit board illustrated in FIG. 3.

Referring to FIG. 5, first, a method of forming a circuit on an insulating layer 110, is provided, and for example, a wiring layer 120 including a first pad 121 and a first pattern 123 is formed using a Semi Additive Process (SAP), a Modified Semi Additive Process (MSAP), and an Embedded Trace Substrate (ETS). Next, a resist film 210 covering the wiring layer 120 is formed on the insulating layer 110, and in an exposure and development process, an opening pattern 211 exposing the first pattern 123 is formed in the resist film 210 in a form of surrounding the first pad 121. Next, the opening pattern 211 is filled with plating to form a first post 131 on the first pattern 123. Next, a resist layer 140 covering the first pad 121, the first pattern 123, and the first post 131 is formed on the insulating layer 110. The resist layer 140 may be formed by applying a liquid material. Next, a first opening h1 exposing the first pad 121 is formed in the resist layer 140 in the exposure and development process. Additionally, a surface treatment layer is formed on a surface of the first pad 121 exposed through the first opening h1. Meanwhile, a second pad 122, a second post 132, a second opening h2, a second surface treatment layer P2 may be formed using substantially the same method as a method for forming the first pad 121, the first post 131, the opening h1, and the first surface treatment layer P1 described above. Meanwhile, a wiring structure 180 and first and second solder bumps 151 and 152 are omitted for convenience of explanation, which may be formed through a known substrate process. The printed circuit board 100A according to the above-described example may be manufactured through a series of processes, and other redundant descriptions will be omitted.

Figure 6:
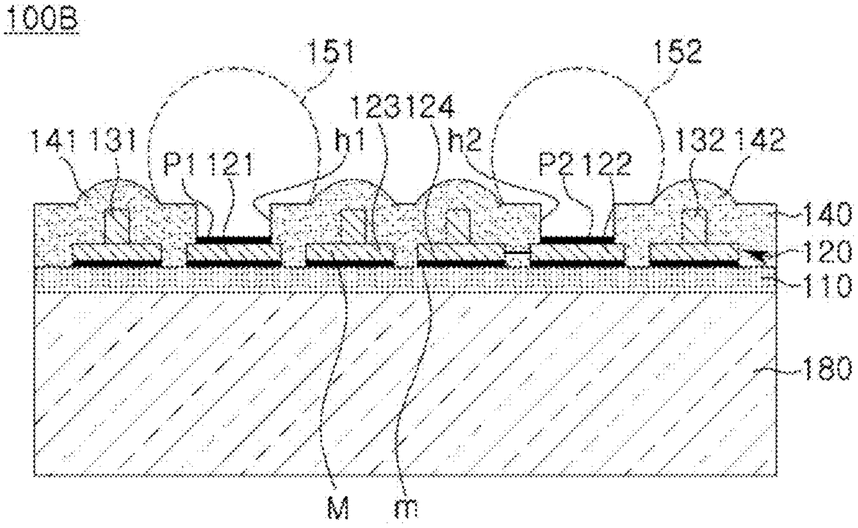
FIG. 6 is a cross-sectional view schematically illustrating another example embodiment of a printed circuit board.

FIG. 6 is a cross-sectional view schematically illustrating another example embodiment of a printed circuit board.

Figure 7:
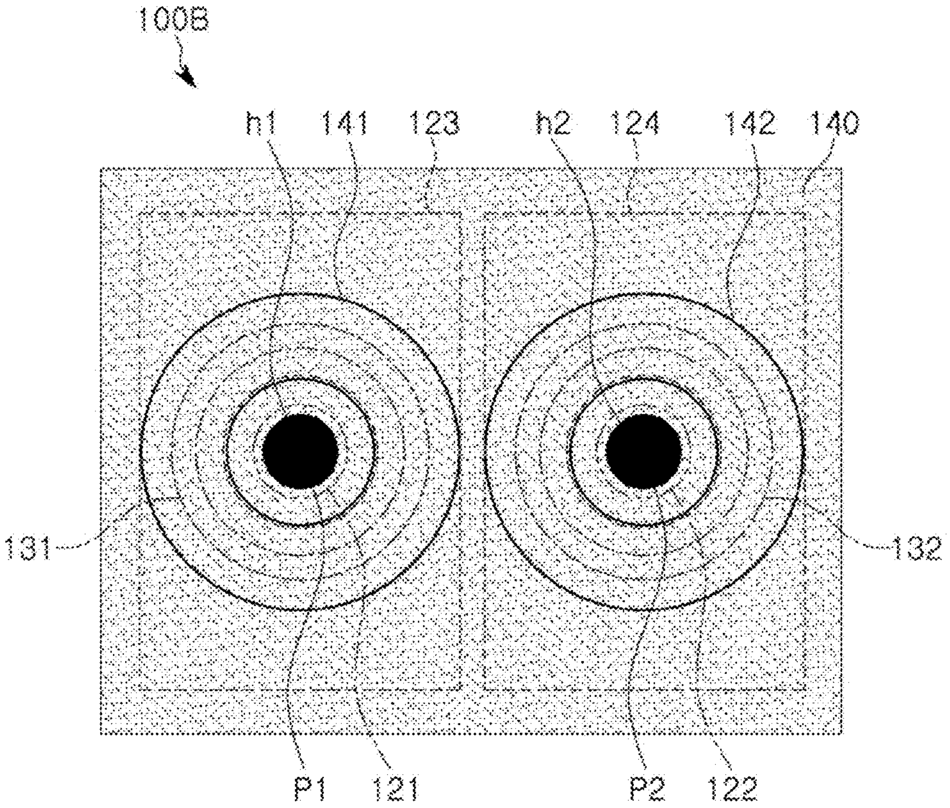
FIG. 7 is a plan view schematically illustrating a top-view of the printed circuit board illustrated in FIG. 6.

FIG. 7 is a plan view schematically illustrating a top-view of the printed circuit board illustrated in FIG. 6

Referring to the drawings, in a printed circuit board 100B according to another example embodiment, the wiring layer 120 may further include a second pattern 124 spaced apart from the first pattern 123, in the printed circuit board 100A according to the above-described example embodiment, and a second post 132 may be disposed on the second pattern 124. The second pattern 124 may be a plain-shaped ground pattern, similarly to the first pattern 123, but the present disclosure is not limited thereto. Other contents are substantially the same as those described above, and thus, redundant descriptions thereof will be omitted.

Figure 8:
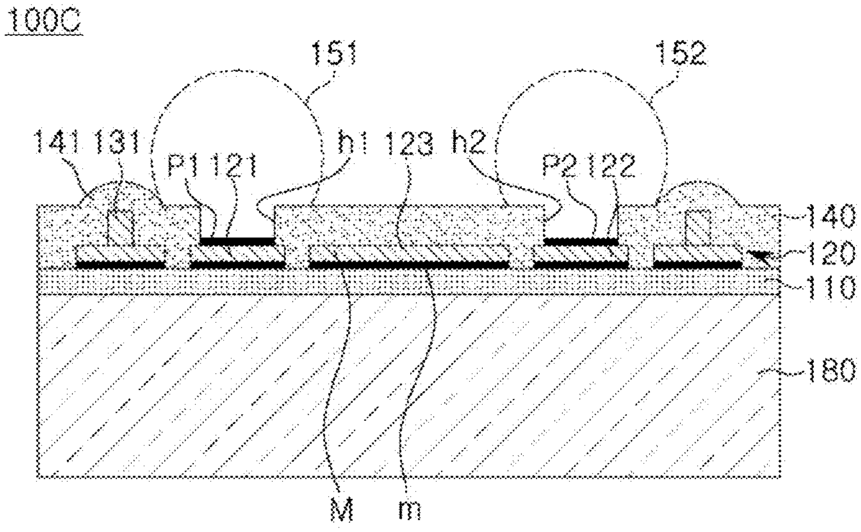
FIG. 8 is a cross-sectional view schematically illustrating another example embodiment of a printed circuit board.

FIG. 8 is a cross-sectional view schematically illustrating another example embodiment of a printed circuit board.

Figure 9:
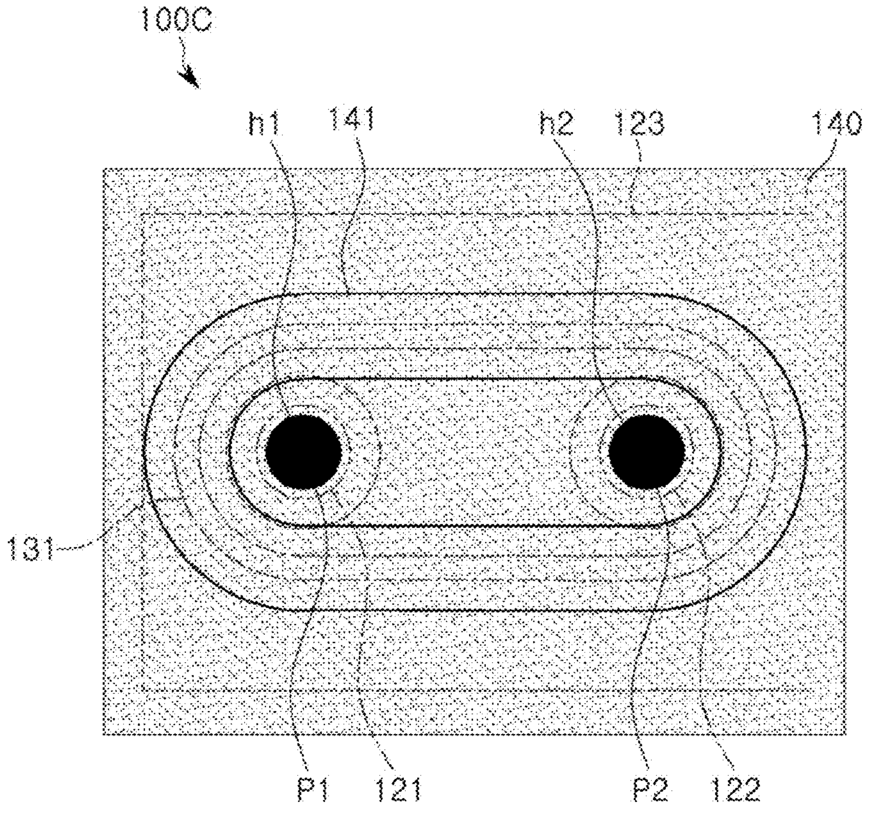
FIG. 9 is a plan view schematically illustrating a top-view of the printed circuit board illustrated in FIG. 8.

FIG. 9 is a plan view schematically illustrating a top-view of the printed circuit board illustrated in FIG. 8.

Referring to the drawings, in a printed circuit board 100C according to another example embodiment, the second post 132 may be omitted in the printed circuit board 100A according to the above-described example embodiment, and the first post 131 may be disposed to surround the first and second pads 121 and 122. Similarly, the second protrusion 142 may be omitted, and the first protrusion 141 may be disposed to surround the first and second openings h1 and h2. For example, there may be cases in which solder bumps connected to ground or power may be connected to each other, and in this case, more diverse designs may be applied to suit the situation. Alternatively, if necessary, an entire region in which electronic components are mounted may be entirely surrounded by the first post 131. In this case, the first protrusion 141 may prevent the underfill from flowing. Other contents are substantially the same as those described above, and redundant descriptions thereof are omitted.

Figure 10:
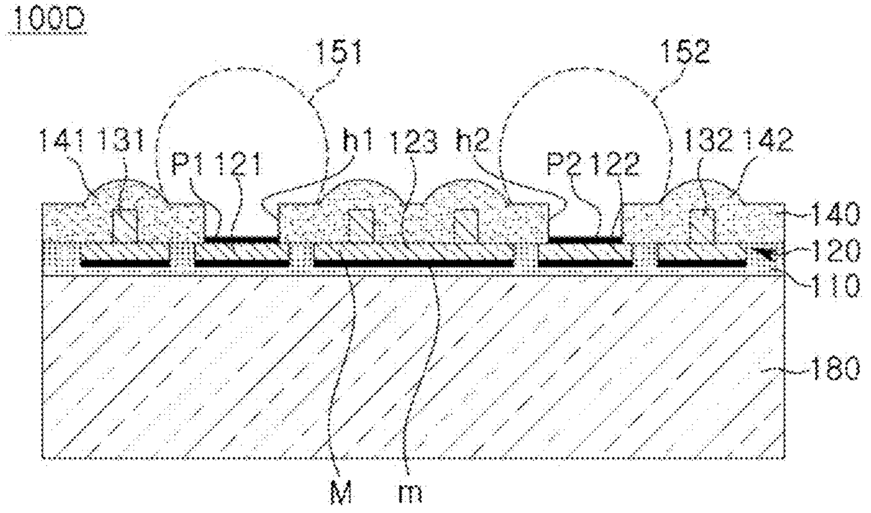
FIG. 10 is a cross-sectional view schematically illustrating another example embodiment of a printed circuit board.

FIG. 10 is a cross-sectional view schematically illustrating another example embodiment of a printed circuit board.

Figure 11:
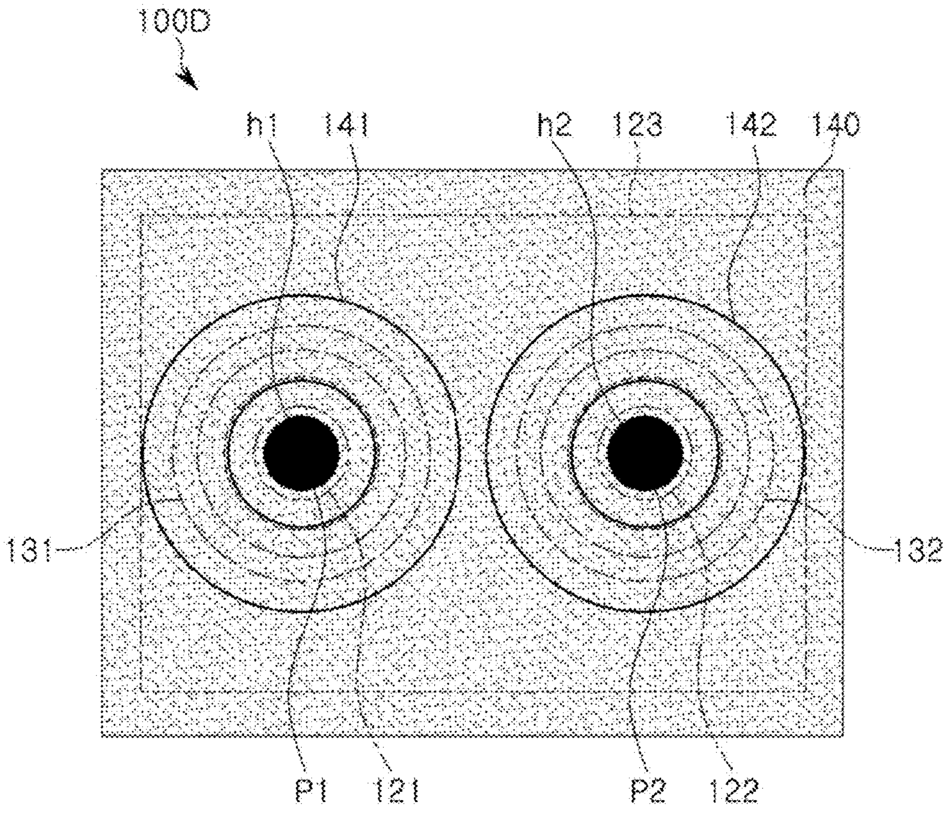
FIG. 11 is a plan view schematically illustrating a top-view of the printed circuit board illustrated in FIG. 10.

FIG. 11 is a plan view schematically illustrating a top-view of the printed circuit board illustrated in FIG. 10.

Referring to the drawings, in a printed circuit board 100D according to another example embodiment, the wiring layer 120 may be buried in an insulating layer 110 based on an upper surface of the insulation layer 110, in the printed circuit board 100A according to the above-described example embodiment. For example, the first and second pads 121 and 122 and the first pattern 123 may be embedded patterns. Other contents are substantially the same as those described above, and redundant descriptions thereof are omitted.

Figure 12:
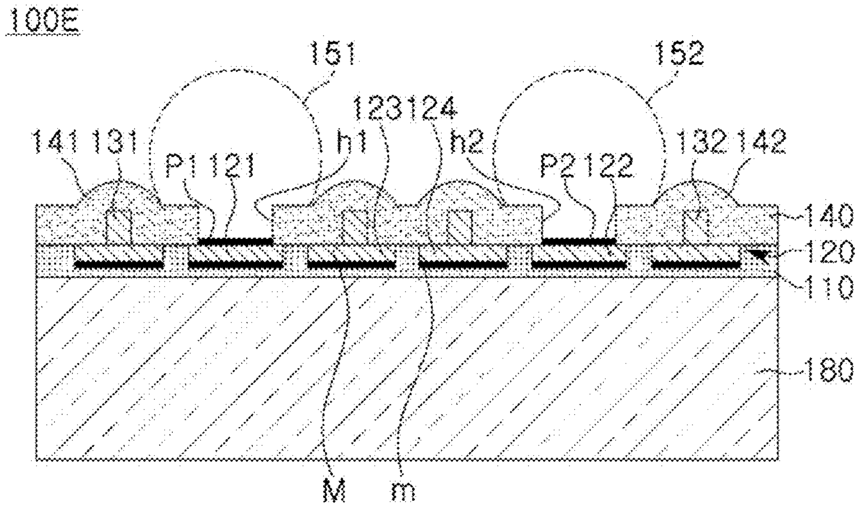
FIG. 12 is a cross-sectional view schematically illustrating another example embodiment of a printed circuit board.

FIG. 12 is a cross-sectional view schematically illustrating another example embodiment of a printed circuit board.

Figure 13:
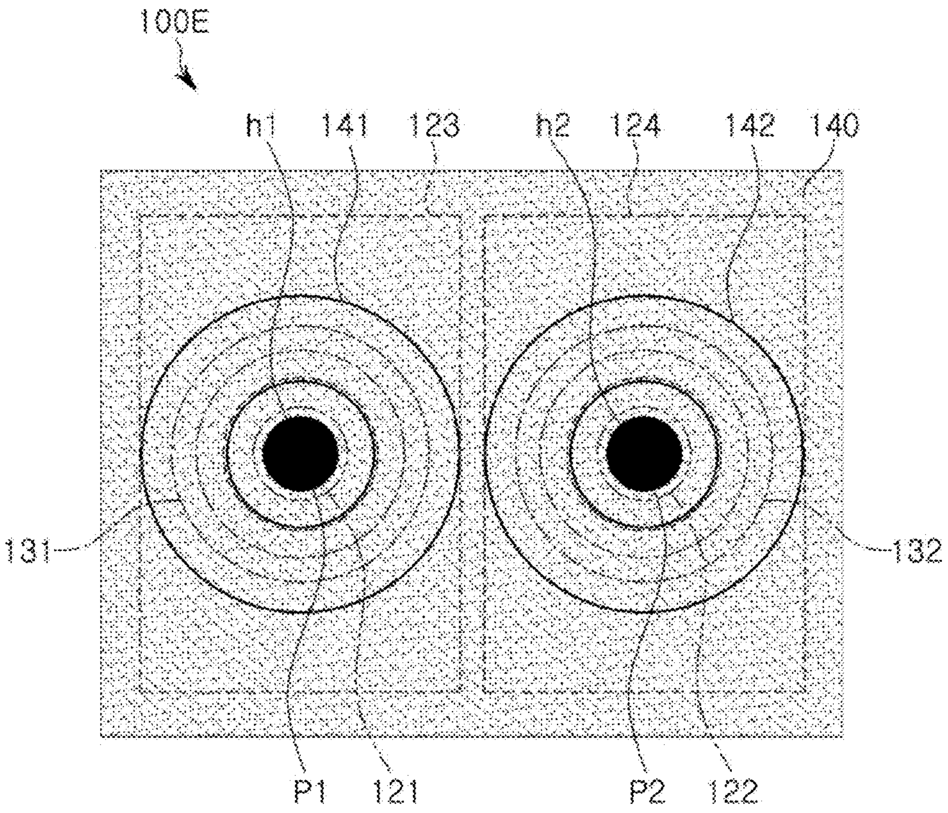
FIG. 13 is a schematic plan view illustrating a top-view of the printed circuit board illustrated in FIG. 12.

FIG. 13 is a schematic plan view illustrating a top-view of the printed circuit board illustrated in FIG. 12.

Referring to the drawings, in a printed circuit board 100E according to another example embodiment, the wiring layer 120 may be buried in an insulating layer 110 based on an upper surface of the insulating layer 110, in the printed circuit board 100B according to another example embodiment described above. For example, the first and second pads 121 and 122 and the first and second patterns 123 and 124 may be embedded patterns. Other contents are substantially the same as those described above, and redundant descriptions thereof are omitted.

Figure 14:
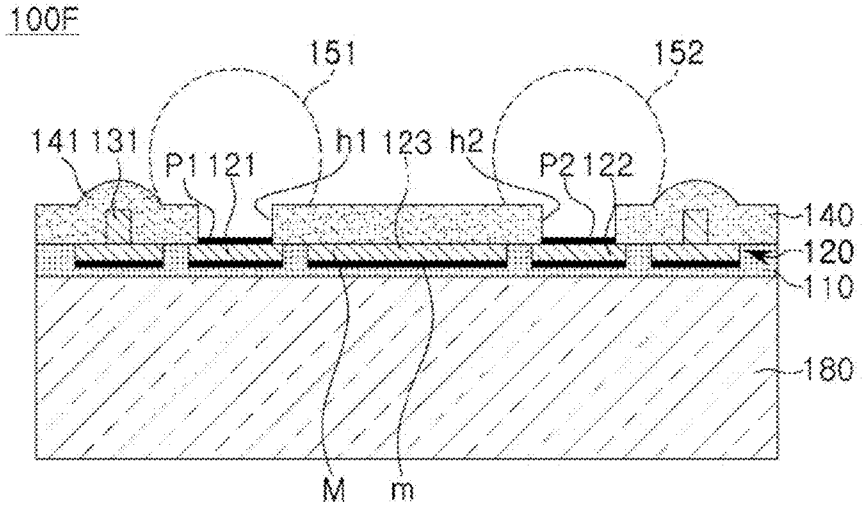
FIG. 14 is a cross-sectional view schematically illustrating another example embodiment of a printed circuit board.

FIG. 14 is a cross-sectional view schematically illustrating another example embodiment of a printed circuit board.

Figure 15:
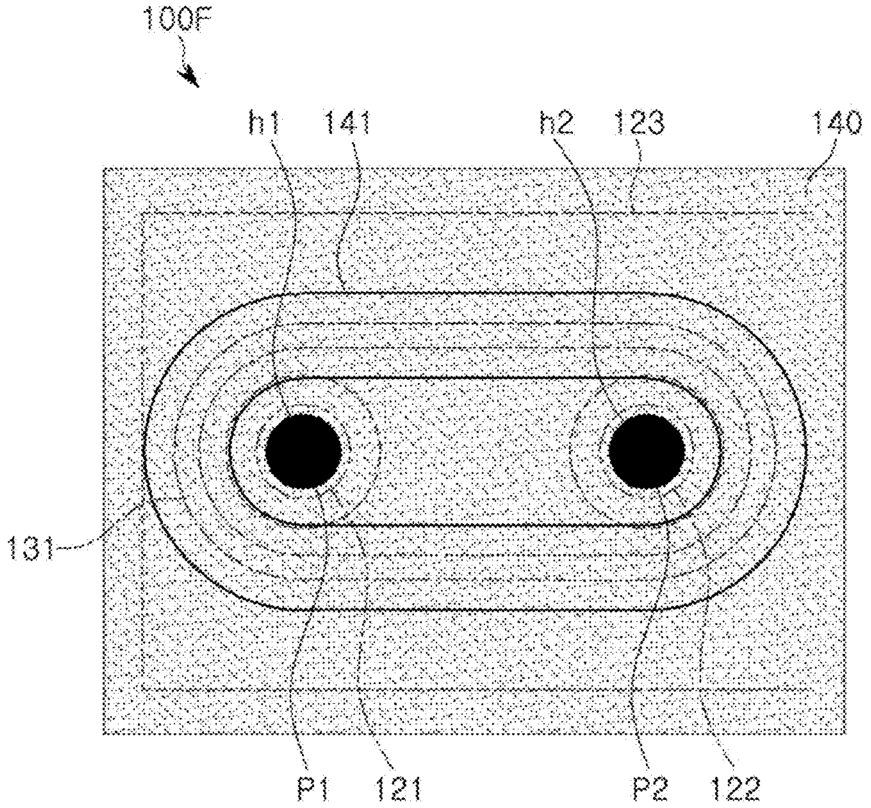
FIG. 15 is a schematic plan view illustrating a top-view of the printed circuit board illustrated in FIG. 14.

FIG. 15 is a schematic plan view illustrating a top-view of the printed circuit board illustrated in FIG. 14.

Referring to the drawings, in a printed circuit board 100F according to another example embodiment, the wiring layer 120 may be buried in an insulating layer 110 based on an upper surface of the insulating layer 110, in the printed circuit board 100C according to another example embodiment described above. For example, the first and second pads 121 and 122 and the first pattern 123 may be embedded patterns. Other contents are substantially the same as those described above, and redundant descriptions thereof are omitted.

In the present disclosure, the expression 'covering' may include a case of covering at least a portion as well as a case of covering the whole, and may also include a case of covering not only directly but also indirectly. Furthermore, the expression 'filling' may include not only a case of completely filling but also a case of approximately filling, and may include, for example, a case in which some pores or voids exist. Additionally, the expression 'surrounding' may include not only the case of completely surrounding but also the case of approximately surrounding. Additionally, exposing may include partial exposing as well as a case of complete exposing, and exposure may refer to exposure from embedding a corresponding component. For example, exposing a pad by an opening may be exposing the pad from a resist layer, and a surface treatment layer or the like may be further disposed on the exposed pad.

In the present disclosure, the meaning on the cross-section may refer to a cross-sectional shape when an object is cut vertically, or a cross-sectional shape when the object is viewed in a side-view. Furthermore, the meaning on a plane may refer to a planar shape when the object is horizontally cut, or a planar shape when the object is viewed in a top-view or a bottom-view.

In the present disclosure, a thickness, a width, a length, a depth, and the like may be measured with a scanning microscope or an optical microscope based on a cross-section in which a printed circuit board is polished or cut. The cut cross-section may be a vertical cross-section or a horizontal cross-section, and each numerical value thereof may be measured based on a required cut cross-section. When the numerical value is not constant, the numerical value may be determined as an average value of values measured at any five points. A width of an upper portion and/or a lower portion of a through-hole may be measured on a cross-section cut along a central axis of the through-hole in the thickness direction of a substrate. A depth of the through-hole may be measured as a distance from an upper portion to a lower portion of each object on a cross-section cut along a central axis of each object in a thickness direction of the substrate.

In the present disclosure, a lower side, a lower portion, and a lower surface are used to refer to a downward direction with respect to a cross-section of a drawing, and an upper side, an upper portion, and an upper surface are used to refer to an opposite direction thereof. Furthermore, a side portion, a side surface, and the like, are used to denote directions, perpendicular to upper and lower surfaces. However, this defines the direction for convenience of explanation, and the scope of the rights of the claims is not particularly limited by the description of such a direction, and the concept of upper and lower portions may be changed at any time.

In the present disclosure, a meaning of being connected is a concept including not only directly connected but also indirectly connected through an adhesive layer or the like. Furthermore, a meaning of electrically connected is a concept including both physically connected and not connected. In addition, expressions such as first and second are used to distinguish one component from another, and do not limit the order and/or importance of the components. In some cases, a first component may be referred to as a second component without departing from the scope of rights, or similarly, the second component may be referred to as the first component.

The expression 'example embodiment used in the present disclosure' does not mean the same embodiment, and is provided to explain different unique characteristics. However, the example embodiments presented above do not preclude being implemented in combination with features of other example embodiments. For example, even if matters described in a particular example embodiment are not described in other example embodiments, they may be understood as explanations related to other example embodiments unless there is an explanation contrary to or contradictory to matters in other example embodiments.

The terms used in the present disclosure are used only to describe an example embodiment and are not intended to limit the present disclosure. In this case, singular expressions include plural expressions unless they are clearly meant differently in the context.

What is claimed is:

1. A printed circuit board, comprising:

an insulating layer;

a wiring layer disposed on an outermost side of the insulating layer and including a first pad and a first pattern;

a first post disposed on the first pattern; and a resist layer disposed on the insulating layer and covering the wiring layer and the first post, wherein the resist layer includes (i) a first protrusion in a region covering the first post and (ii) a first opening over the first pad.

2. The printed circuit board according to claim 1, further comprising a second post that is disposed on the first pattern and that is spaced apart from the first post, wherein the wiring layer further includes a second pad spaced apart from the first pad, and the resist layer further includes (i) a second protrusion in a region covering the second post and (ii) a second opening over the second pad.

3. The printed circuit board according to claim 2, wherein the first post is disposed to surround the first pad, the second post is disposed to surround the second pad, the first protrusion is disposed to surround the first opening, and the second protrusion is disposed to surround the second opening.

4. The printed circuit board according to claim 2, further comprising:

a first surface treatment layer disposed in the first opening and on an outermost surface of the first pad;

a second surface treatment layer disposed in the second opening and on an outermost surface of the second pad;

a first solder bump disposed on the resist layer, filling the first opening, and connected to the first surface treatment layer; and a second solder bump disposed on the resist layer, filling the second opening, and connected to the second surface treatment layer.

5. The printed circuit board according to claim 1, wherein the wiring layer further includes a second pad spaced apart from the first pad and a second pattern spaced apart from the first pattern, the printed circuit board further comprises a second post that is disposed on the second pattern and that is spaced apart from the first post, and the resist layer further includes (i) a second protrusion in a region covering the second post and (ii) a second opening over the second pad from the resist layer.

6. The printed circuit board according to claim 5, wherein the first post is disposed to surround the first pad, the second post is disposed to surround the second pad, the first protrusion is disposed to surround the first opening, and the second protrusion is disposed to surround the second opening.

7. The printed circuit board according to claim 5, further comprising:

a first surface treatment layer disposed in the first opening and on an outermost surface of the first pad;

a second surface treatment layer disposed in the second opening and on an outermost surface of the second pad;

a first solder bump disposed on the resist layer, filling the first opening, and connected to the first surface treatment layer; and a second solder bump disposed on the resist layer, filling the second opening, and connected to the second surface treatment layer.

8. The printed circuit board according to claim 1, wherein the wiring layer further includes a second pad spaced apart from the first pad, and the resist layer further has a second opening over the second pad.

9. The printed circuit board according to claim 8, wherein the first post is disposed to surround the first and second pads, and the first protrusion is disposed to surround the first and second openings.

10. The printed circuit board according to claim 8, further comprising:

a first surface treatment layer disposed in the first opening and on an outermost surface of the first pad;

a second surface treatment layer disposed in the second opening and on an outermost surface of the second pad;

a first solder bump disposed on the resist layer, filling the first opening, and connected to the first surface treatment layer; and a second solder bump disposed on the resist layer, filling the second opening, and connected to the second surface treatment layer.

11. The printed circuit board according to claim 1, wherein the wiring layer protrudes away from the outermost side of the insulating layer.

12. The printed circuit board according to claim 1, wherein the wiring layer is buried in the insulating layer based on an upper surface of the insulating layer.

13. The printed circuit board according to claim 1, further comprising:

a wiring structure including a plurality of insulating layers, a plurality of wiring layers, and a plurality of via layers, wherein the insulating layer on which the wiring layer is disposed is disposed on an outermost side of the plurality of insulating layers.

14. The printed circuit board according to claim 1, wherein the resist layer does not cover at least a portion of the first pad.

15. The printed circuit board according to claim 1, wherein the first post is embedded in the resist layer.

16. The printed circuit board according to claim 1, wherein the first post includes copper.

17. The printed circuit board according to claim 1, wherein the first post overlaps the first pattern in a stacking direction of the printed circuit board.

18. A printed circuit board, comprising:

an insulating layer;

a metal pad disposed at an outermost side of the insulating layer;

a metal post disposed on the outermost side of the insulating layer and disposed around the metal pad, wherein an outermost surface of the metal post is disposed above an outermost surface of the metal pad; and a resist layer disposed on the outermost surface of the insulating layer, and covering the metal pad and the metal post, wherein an outermost surface of the resist layer protrudes from a region covering the metal post and includes an opening over the metal pad.

19. The printed circuit board according to claim 18, wherein the metal post surrounds the metal pad in a ring shape.

20. The printed circuit board according to claim 19, comprising a plurality of the metal pad and a plurality of the metal post, and each of the plurality of the metal post surrounds each of the plurality of the metal pad in a ring shape.

* * * * *